United States Patent [19]
Meyerhoff

[11] 4,060,693
[45] Nov. 29, 1977

[54] AC SUPERCONDUCTING ARTICLES

[75] Inventor: Robert Wagner Meyerhoff, Croton-on-Hudson, N.Y.

[73] Assignee: Union Carbide Corporation, New York, N.Y.

[21] Appl. No.: 596,839

[22] Filed: Aug. 7, 1975

Related U.S. Application Data

[60] Division of Ser. No. 359,377, May 11, 1973, Pat. No. 3,906,412, which is a continuation of Ser. No. 160,926, July 8, 1971, abandoned, which is a continuation of Ser. No. 701,594, Jan. 30, 1968, abandoned.

[51] Int. Cl.$^2$ .......................................... H01B 12/00
[52] U.S. Cl. .............................. 174/126 S; 174/15 S
[58] Field of Search ..................... 174/126 S, 15 S; 335/216

[56] References Cited
U.S. PATENT DOCUMENTS 3,292,016  12/1966  Kafka ................................. 174/15 S
3,501,581  3/1970  Edwards ........................... 174/126 S
3,562,401  2/1971  Long ................................... 174/15 S

OTHER PUBLICATIONS

"Tubular Niobium Copper Conductors for AC Superconductive Power Transmission" in Cryogenics, Aug. 1972, vol. 12, No. 4.

Primary Examiner—E. A. Goldberg
Attorney, Agent, or Firm—John R. Doherty

[57] ABSTRACT

A novel AC superconducting article comprising a composite structure having a superconducting surface along with a high thermally conductive material wherein the superconducting surface has the desired physical properties, geometrical shape and surface finish produced by the steps of depositing a superconducting layer upon a substrate having a predetermined surface finish and shape which conforms to that of the desired superconducting article, depositing a supporting layer of material on the superconducting layer and removing the substrate, the surface of the superconductor being a replica of the substrate surface.

6 Claims, 8 Drawing Figures

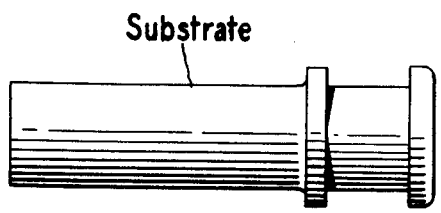
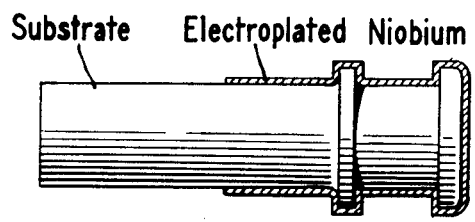
Fig. 1.  Fig. 2.
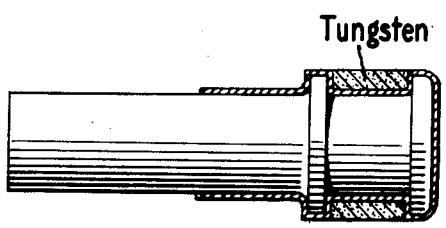
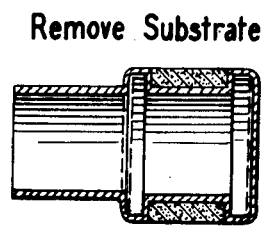
Fig. 3.  Fig. 4.
Cut Out Cavity Section
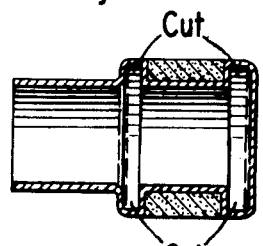
Fig. 5.  Fig. 6.
Finished R.F. Cavity Section
Fig. 7.

AC SUPERCONDUCTING ARTICLES

This application is a division of application Ser. No. 359,377, filed May 11, 1973, now U.S. Pat. No. 3,906,412 issued on Sept. 16, 1975, which in turn is a continuation of application Ser. No. 160,926 filed July 8, 1971, now abandoned, which in turn is a further continuation of application Ser. No. 701,594, filed Jan. 30, 1968, now abandoned.

This invention relates to AC superconducting articles and to a method for making the same.

BACKGROUND

Many known DC devices such as electromagnets and energy storage cells have, for certain applications, been replaced by equivalent superconducting devices whose performance generally is far superior. In contrast to the DC case, however, when AC magnetic fields and/or currents are involved, superconducting devices appear to possess energy losses which may be comparable to or even greater than their conventional counterparts. Although the energy losses in superconductors depend upon both frequency and magnetic reversibility, it is presently believed that the major limitation in the performance of AC superconducting devices is due to the presence of hysteretic losses arising from the magnetic irreversibility in the superconductor. For this reason, superconducting AC devices depend for their practicality upon reducing the energy (AC) losses to an acceptably low magnitude. The energy loss in a superconducting AC device is determined by the following factors:

1. operating frequency;
2. peak amplitude of the AC magnetic field at the surface of the superconductor;
3. operating temperature;
4. physical properties of the superconducting material employed; and
5. the geometrical and physical characteristics of the surface.

In most cases the operating frequency is determined by the nature of the device and is therefore essentially fixed. The second and third factors influence not only the energy loss but the performance of the superconducting device as well. In AC devices such as RF cavities for beam separators the magnetic field is required to be as high as is possible for the superconductors employed. In addition, since the critical field of superconductors increases with decreasing temperature it is necessary to operate such devices at as low a temperature as is economically practical. Hence, the only remaining factors which may be truly varied to minimize the energy losses are the physical properties and surface characteristics of the superconductor employed. An ideal material would exhibit zero loss at the highest magnetic field. Of all elemental superconductors, niobium is preferred for AC applications where a high magnetic field is required. Niobium in its commercially available state, however, will yield relatively high AC losses. Recent experimentation has established that the presence of impurities in the virgin material is the major contributing factor to such AC losses. Thus, ultra-high purity niobium should and does exhibit almost perfect magnetic reversibility and as such almost zero electrical resistivity. Equally important is the reduction of AC losses attributable to surface imperfections which would otherwise limit the advantages to be gained from the use of ultra-high pure niobium in a practical superconducting device. This further complicates the fabrication of a superconducting AD device where complex shapes are involved. In fact, many uncomplicated superconductor geometries, depending upon the desired location for the active superconductor surface, are not susceptible to presently known techniques for removing surface irregularities.

The fabrication of a superconducting radio frequency (RF) cavity highlights the difficulties presently encountered in the art relating to the general fabrication of superconducting AC devices where low energy losses are desirable. In principle, all that is required for a superconducting niobium RF cavity is a solid high purity niobium structure having the desired shape and surface finish. As a practical matter, however, to machine an RF cavity from a solid piece of niobium where complex internal shapes are involved is nearly impossible not to mention the prohibitive cost of the high purity niobium required. Furthermore, except for the very highest purity niobium the losses are such that the thermal conductivity of thick niobium walls would be too low to allow the heat dissipated in the cavity to be extracted at the rate necessary to maintain the inner wall of the cavity at a temperature sufficiently close to that of the surrounding liquid helium bath employed to maintain the material in the superconducting state. At present, therefore, no satisfactory technique exists for fabricating an AC superconducting article, such as an RF cavity, in one piece, where low AC losses are required.

Objects

Accordingly, it is a main object of the invention to provide an AC superconducting article having low AC losses.

It is a further object of this invention to provide a superconducting niobium RF cavity.

It is an even further object of this invention to provide a method for fabricating superconducting RF cavities in one piece.

It is another object of this invention to provide a method for fabricating in one piece a multiplicity of integrally connected RF cavities.

Further objects and features of the present invention will become apparent from a reading of the following specification and claims in connection with the accompanying drawings in which:

FIGS. 1-7 illustrate the novel steps used to fabricate a single superconducting RF cavity in one piece.

SUMMARY

Figure 8:
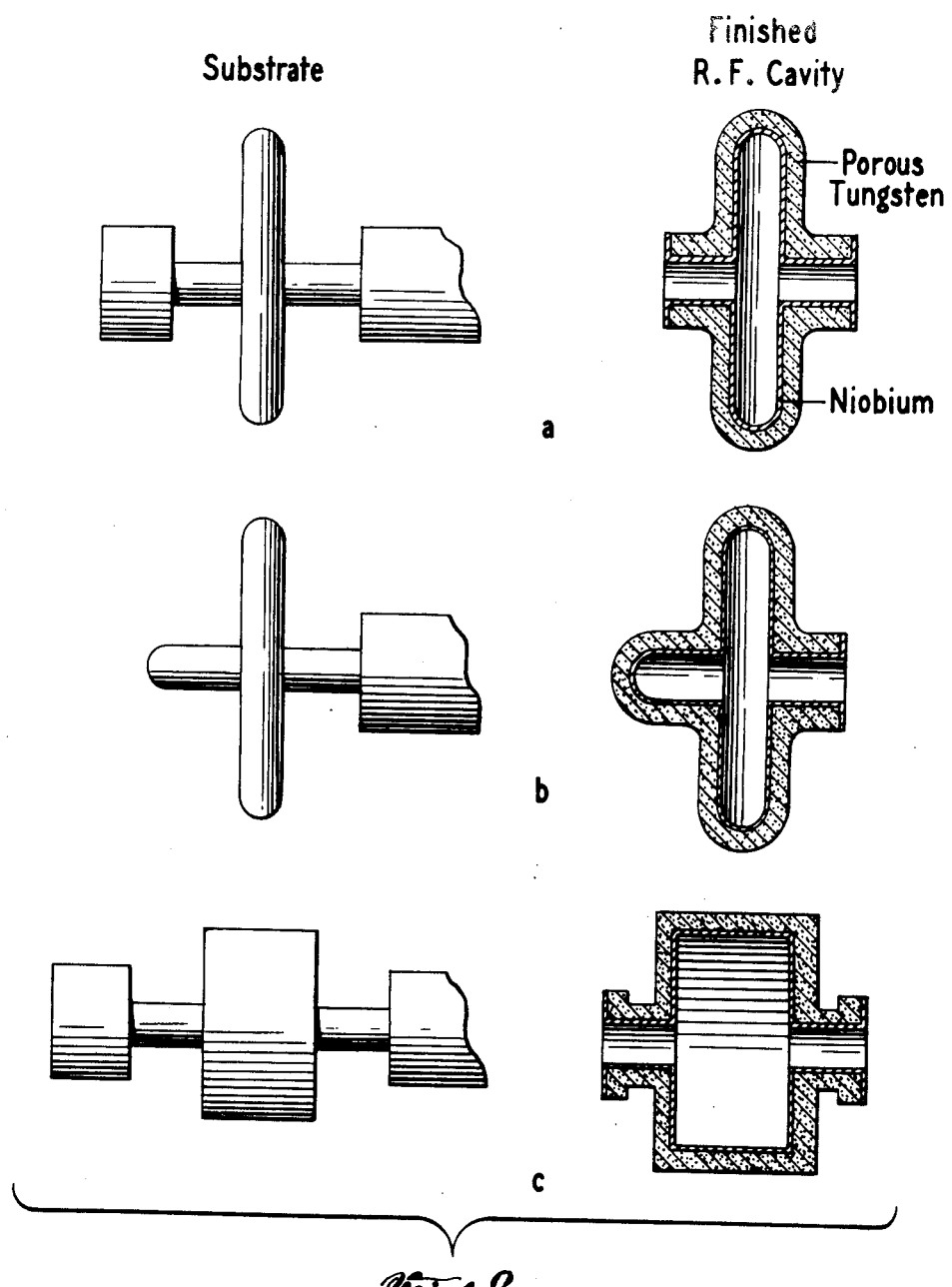
FIG. 8 shows a number of examples of complex single RF cavity geometries which may be fabricated in accordance with the invention.

This invention is predicated upon the discovery that a useful AC superconducting article with desired purity of material and geometrical configuration can be produced by the steps of depositing a superconducting layer upon a substrate of predetermined surface finish and shape which conforms to that of the superconducting article, depositing a supporting layer of material on the superconducting layer and removing the substrate to form a composite structure of the superconducting layer and supporting material, the surface of superconductor being a replica of the substrate surface.

In accordance with the above process a novel superconducting article is produced having the desired surface finish and shape which in its broadest aspect comprises: a supporting structure and a coating of superconducting metallic material bonded to the surface of said substrate, the material consisting of niobium having the following ingredients in parts per million: C<1, $O_2$<50, $H_2$<1, $N_2$>1, Fe<18, Ni<20, Cr<20, Ta<10, W<2.

Although the invention will be hereafter explained in detail with reference to either a single superconducting RF cavity or a multiplicity of integrally connected RF cavities, it is not to be construed as limited thereto. Other AC superconducting articles useful for AC power transmission lines, transformers, gyroscopes, etc. may be fabricated according to the teachings of this invention.

As hereinbefore mentioned, niobium in its virgin state does not possess the superconducting properties required for certain AC applications and is particularly unsuited without purification for application to RF cavities. Moreover, conventional processes such as electron beam melting, chemical vapor deposition and electroplating etc. are not capable in themselves of both purifying the niobium to a satisfactory extent and providing a desired shape. Some of these processes can produce niobium having the necessary properties if the niobium deposit is subsequently vacuum outgassed and annealed. However, the niobium deposit produced is not in readily usable form. As a result of a recent innovation in the conventional electroplating technique, dense structurally coherent deposits of niobium are realizable. This process may be advantageously employed in the present invention to fabricate RF cavities of complex shape as will be explained later in the specification. The electroplating process referred to above is a Faradaic fused salt process employing an all fluoride electrolytic bath consisting essentially of: a base melt of at least one fluoride of potassium, rubidium, or cesium and at least one fluoride of other elements higher in the electromotive series than the metal to be deposited, and at least one fluoride of each metal to be deposited. The preferred salt constituency for depositing niobium consists of potassium fluoride (KF), sodium fluoride (NaF), lithium fluoride (LiF) and potassium niobium fluoride ($K_2NbF_7$). The proportions of the fluorides in the melt, the temperature of the melt and the electrolyzing current density are adjusted to produce a dense, fine grain, structurally coherent high purity deposit upon a substrate which serves as the cathode. The niobium deposited is over 99.99% pure with an impurity composition as shown below in Table I. Even this extremely low concentration of impurities is unsatisfactory for RF cavity application. It is not until the concentration of the interstitial impurities $O_2$, $H_2$ and $N_2$ are substantially reduced that the material is rendered suitable to serve as an RF cavity. Hence, ultra-high purity niobium for purposes of this disclosure consists essentially of niobium with impurities whose concentrations do not exceed those given in Table I.

TABLE I

| Impurity | High Purity Niobium p.p.m. | Ultra-high Purity Niobium p.p.m. |
|---|---|---|
| C | <1 | <1 |
| $O_2$ | <50 | <1 |
| $H_2$ | <1 | <1 |
| $N_2$ | >1 | <1 |
| Fe | <18 | <18 |
| Ni | <20 | <20 |
| Cr | <20 | <20 |
| Ta | <10 | <10 |
| W | <2 | <2 |

The usual approach considered for fabricating a superconducting RF cavity is to deposit a thin layer of superconductor on the inside surface of a preformed structure of material of high thermal conductivity and to polish the superconducting surface to the required finish. The preformed structure acts as a support for the superconducting layer when the cavity is evacuated for actual use and, of course, provides the desired shape for the inner wall of the superconductor. It is important that the surface finish be as nearly perfect as possible. The term "perfect" for purposes of this disclosure is intended to mean a surface substantially free of imperfections. Although, the exact mechanism through which surface imperfections contribute to AC losses is not clearly known, it has been observed that at magnetic fields below the lower critical field of a superconductor, the magnitude of the AC losses decreases as the quality of the surface finish is improved. Polishing to achieve the quality of surface finish required for low AC losses is a most difficult if not impossible operation to perform, especially where complicated geometrical shapes are involved. Furthermore, the ultra-high purity requirement for the niobium necessitates vacuum outgassing. This requires that the supper material have a melting point at least above that necessary to vacuum outgas niobium. It must also have a high thermal conductivity. This requirement of high thermal conductivity is as stated hereinbefore to permit the heat dissipated in the cavity walls to be extracted at the rate necessary to maintain the interior niobium wall at a temperature sufficiently close to that of the surrounding cryogenic liquid used to maintain the niobium in the superconducting state. Few easily fabricable materials possess the combined high melting point and high thermal conductivity required for satisfactory performance as a cavity support structure. For these reasons vacuum outgassed niobium cavities have not been fabricated by this conventional approach.

All problems associated with this conventional approach have been solved by a unique combination of novel steps. These steps are illustrated in FIGS. 1-7 inclusive of the drawings. The first step, shown in FIG. 1, is the fabrication of a substrate designed to conform to the inside shape of the desired RF cavity. This may be accomplished by a simple machining operation. The substrate itself forms no part of the end product i.e. the RF cavity; its sole purpose is to function as a mold or core to produce the desired geometrical form and surface finish required for the superconducting surface within the RF cavity. The only restriction placed on the material employed for the substrate is that it must be compatible with the subsequent steps of this invention. Copper has been used satisfactorily. Other materials such as iron, ferrous alloys or nickel could also be used. After forming to shape, the substrate is mechanically polished and/or electropolished to obtain an extremely smooth surface finish. Since the substrate is to be used to provide the surface finish for the superconductor, its surface must have a finish equal to or better than the finish required of the superconductor.

The second step in the process as shown in FIG. 2 consists of depositing a coating of niobium several mils in thickness over the finished substrate surface. Although any process may be used which will result in a high purity niobium deposit, the aforementioned fused salt electroplating process is preferred, because of the dense, fine grain, structurally coherent and uniform deposit produced. In addition, the electroplating process has a relatively high throwing power which simplifies the formation of uniform deposits over complex shapes. Moreover, by the use of this process the shape and finish of the niobium at the niobium substrate interface faithfully replicates the shape and finish of the substrate. After removal of the substrate, surface finishes with a roughness of less than 5 micro-inches RMS (root means square) have been measured. Accordingly, many desirable complex geometrical shapes with very smooth finishes may be fabricated by the process of this invention. The simple configuration shown in FIGS. 1–7 is used merely to illustrate the process.

Articles formed at this intermediate stage in the process by depositing relatively high pure niobium upon the surface of the substrate have a plurality of uses. For example, when the substrate is copper or other material having a high effective thermal conductivity, the intermediate product is independently useful as a conductor for AC power transmission. In the case of a tubular substrate, the niobium may be electroplated onto either its inner or outer surface. The substrate may function as the supporting structure for the niobium or it may be subsequently removed after another support structure is provided. Where the substrate is removed, the niobium will possess a shape and surface finish substantially equal to those of the substrate. This shape is maintained by the support structure. Furthermore, complex conductor shapes for other AC superconducting devices such as AC transformers and gyroscopes may be fabricated at this intermediate stage in the process.

The third step in the process of fabricating a superconducting RF cavity as shown in FIG. 3 consists of depositing a porous refractory material over the electroplated niobium. Although tungsten is preferred, any refractory material such as molybdenum, tantalum, niobium, graphite, iridium, platinum or refractory ceramics may be chosen. The refractory coating is preferably deposited by plasma plating. In this process refractory powder is introduced into the high velocity, high temperature effluent of a non-transferred arc being directed against the surface upon which the tungsten deposit is desired. Other processes such as powder metallurgy, electroplating or chemical vapor deposition are equally applicable. Alternatively the supporting refractory material may be provided by bonding a preformed structure to the surface. The tungsten coating forms a structure which serves to support the niobium during the vacuum outgassing and to provide the mechanical support necessary in the finished RF cavity. In addition, when the RF cavity is actually put into use, the porosity of the tungsten enables the cryogenic liquid bath surrounding the cavity to circulate through the pores giving rise to an extremely high effective thermal conductivity between the niobium inner cavity wall and the surrounding cryogenic bath. This is especially effective when the cryogenic bath is superfluid liquid helium.

The next step after the porous layer of tungsten is deposited is to remove the copper substrate leaving a composite niobium porous tungsten article as shown in FIG. 4. The copper substrate may be removed by dissolving it in dilute nitric acid. Alternatively, the substrate could be removed either electrolytically or by melting the substrate or by a machining operation or any combination of the above procedures. The active niobium surface will be that surface which was originally in contact with the copper substrate and will therefore have a surface finish which is a replica of the original substrate surface. The composite niobium tungsten article is then vacuum outgassed and annealed at a temperature range between 970°–2400° C. and at a pressure range between $10^{-12} - 4 \times 10^{-8}$ Torr reducing the concentration of each of the interstitial impurities nitrogen, oxygen and hydrogen to less than one part per million. Vacuum outgassing at this temperature and pressure range will also result in some sintering of the porous tungsten which will both increase the mechanical strength of the tungsten and improve the quality of the tungsten-niobium bond. A schematic representation of one vacuum outgassing system employed is shown in FIG. 5. The composite niobium tungsten article is placed upon platform 10 contained within the vacuum chamber 12. The flanged extension 14 of the niobium tungsten article is connected by means not shown to the shaft 16 of the ion pump vacuum system 18 which when activated will pump the interior of the cavity to a pressure in the aforementional range appropriate to the outgassing temperature. A secondary or auxiliary vacuum pump system 20 is connected to the interior of vacuum chamber 12 for maintaining a vacuum in the chamber interior of approximately $10^{-5}$ Torr. The secondary pump system is optional; its primary purpose is to protect the tungsten from oxidation. This could be alternately accomplished by injecting a very pure inert gas into the interior of chamber 12. A resistance furnace 24 and power supply 22 are used to heat the cavity to a temperature within the aforementioned range appropriate to the outgassing pressure in the interior of the cavity.

After outgassing, the ends of the cavity are cut off by a maching operation at the points illustrated in FIG. 6 thus forming the completed cavity as shown in FIG. 7. The completed cavity is a hollow section with an exposed perfectly, finished interior wall of ultra-high purity niobium bonded to the supporting outer porous tungsten wall. The ends of the cavity section have an outer lining or layer of ultra-high purity niobium. The coated end surfaces are necessary as sealing surfaces when it is desired to join a number of cavities together in actual operation.

In accordance with this invention many cavity configurations can be fabricated as a single solid section. In FIG. 8a, b and c, RF cavity sections of complex shape are illustrated showing the initial substrate configurations and finished end products.

While the invention has been described in terms of the fabrication of one RF cavity as a single composite structure it is clear that by suitably forming the substrate to represent the interior shape of a series of cavities and by following the steps of this invention, the resulting composite structure will form a multiplicity of integrally connected cavities.

The objectives of the present invention i.e., the fabrication of practical AC superconductive devices with acceptably low losses may be achieved in some cases without practicing all of the steps as outlined. The conductor for AC power transmission represents one such case. In this and other cases where vacuum outgassing may not be necessary a refractory material is not required for the supporting structure. Therefore, non-refractory materials which have the required thermal and mechanical properties may be employed. Additionally, in devices where the power loss per unit area is sufficiently small, the supporting structure need not have as high a thermal conductivity as that provided by the porous support. In these cases a solid non-porous support is adequate.

Other modifications and variations of the present invention are possible in the light of the present teachings without departing from the underlying scope of the present invention.

What is claimed is:

1. An AC superconducting transmission line for continuously transmitting AC power at power line frequencies with very low AC hysteretic losses which remain low even at high current density and/or high AC magnetic fields comprising: a multilayer tubular conductor wherein an outermost layer of said tubular conductor is niobium and wherein at least one other layer is of highly conductive material, said niobium layer containing the following ingredients in parts per million:

C — <1
$O_2$ — <50
$H_2$ — <1
$N_2$ — >1
Fe — <18
Ni — <20
Cr — <20
Ta — <10
W — <2

2. An AC superconducting transmission line for continuously transmitting AC power at power line frequencies with very low AC hysteretic losses which remain low even at high current density and/or high AC magnetic fields comprising: a multilayer tubular conductor wherein an outermost layer of said tubular conductor is niobium and wherein at least one other layer is of highly conductive material, said niobium layer containing the following ingredients in parts per million:

C — <1
$O_2$ — <1
$H_2$ — <1
$N_2$ — <1
Fe — <18
Ni — <20
Cr — <20
Ta — <10
W — <2

3. An AC superconducting transmission line for continuously transmitting AC power at power line frequencies with very low AC hysteretic losses which remain low even at high current density and/or high AC magnetic fields comprising: a multilayer tubular conductor wherein an outermost layer of said tubular conductor is niobium and wherein at least one other layer is of highly conductive material, said niobium layer containing oxygen in an amount less than about 50 parts per million, hydrogen in an amount less than about 1 part per million and nitrogen in an amount greater than about 1 part per million.

4. An AC superconducting transmission line for continuously transmitting AC power at power line frequencies with very low AC hysteretic losses which remain low even at high current density and/or high AC magnetic fields comprising: a multilayer tubular conductor wherein an outermost layer of said tubular conductor is niobium and wherein at least one other layer is of higher conductive material selected from the group consisting of copper, iron, ferrous alloys and nickel, said niobium layer containing the following ingredients in parts per million:

C — <1
$O_2$ — <50
$H_2$ — <1
$N_2$ — >1
Fe — <18
Ni — <20
Cr — <20
Ta — <10
W — <2

5. An AC superconducting transmission line for continuously transmitting AC power at power line frequencies with very low AC hysteretic losses which remain low even at high current density and/or high AC magnetic fields comprising: a multilayer tubular conductor wherein an outermost layer of said tubular conductor is niobium and wherein at least one other layer is of highly conductive material selected from the group consisting of copper, iron, ferrous alloys and nickel, said niobium layer containing oxygen in an amount less than about 50 parts per million, hydrogen in an amount less than about 1 part per million and nitrogen in an amount greater than about 1 part per million.

6. An AC superconducting transmission line for continuously transmitting AC power at power line frequencies with very low AC hysteretic losses which remain low even at high current density and/or high AC magnetic fields comprising: a multilayer tubular conductor wherein an outermost layer of said tubular conductor is niobium and wherein at least one other layer is of highly conductive material, said niobium layer containing oxygen, hydrogen and nitrogen each in an amount less than about 1 part per million.

* * * * *